(12) United States Patent  
Ferry

(10) Patent No.: US 9,116,785 B2
(45) Date of Patent: Aug. 25, 2015

(54) EMBEDDED TESTER

(71) Applicant: Teradyne, Inc., North Reading, MA (US)

(72) Inventor: Joshua Mason Ferry, Methuen, MA (US)

(73) Assignee: Teradyne, Inc., North Reading, MA (US)

( * ) Notice: Subject to any disclaimer, the term of this patent is extended or adjusted under 35 U.S.C. 154(b) by 190 days.

(21) Appl. No.: 13/746,764

(22) Filed: Jan. 22, 2013

(65) Prior Publication Data

US 2014/0207402 A1    Jul. 24, 2014

(51) Int. Cl.
*G01R 31/00* (2006.01)
*G06F 17/00* (2006.01)
*G01R 31/28* (2006.01)
*G01R 31/319* (2006.01)
*H04L 29/06* (2006.01)
*G01R 31/3187* (2006.01)

(52) U.S. Cl.
CPC ............... *G06F 17/00* (2013.01); *G01R 31/28* (2013.01); *G01R 31/3187* (2013.01); *G01R 31/31908* (2013.01); *G01R 31/31919* (2013.01); *H04L 69/03* (2013.01)

(58) Field of Classification Search
USPC .......................................................... 702/119
See application file for complete search history.

(56) References Cited

U.S. PATENT DOCUMENTS

| 5,878,051 | A | 3/1999 | Sharma et al. |
| 7,216,273 | B2 | 5/2007 | Phelps et al. |
| 7,222,261 | B2 | 5/2007 | Song |
| 7,222,280 | B1* | 5/2007 | West et al. .................... 714/736 |
| 7,484,142 | B2* | 1/2009 | Crump et al. ................. 714/718 |
| 8,195,419 | B2 | 6/2012 | Conner |
| 2003/0033127 | A1 | 2/2003 | Lett |
| 2005/0204029 | A1 | 9/2005 | Connolly et al. |
| 2008/0089682 | A1 | 4/2008 | Sylvester et al. |
| 2008/0189580 | A1 | 8/2008 | Kim et al. |
| 2009/0112548 | A1 | 4/2009 | Conner |
| 2009/0113245 | A1 | 4/2009 | Connor |
| 2010/0235135 | A1* | 9/2010 | Conner ........................ 702/119 |
| 2011/0276302 | A1* | 11/2011 | Rivoir ......................... 702/117 |
| 2012/0136613 | A1 | 5/2012 | Hill |
| 2012/0153982 | A1 | 6/2012 | Lee |

(Continued)

FOREIGN PATENT DOCUMENTS

| JP | 2007-156728 | 6/2007 |
| WO | WO2010-011387 | 1/2010 |

OTHER PUBLICATIONS

"ScanWorks FPGA-Controlled Test Developments" ScanWorks Platform for Embedded Instruments, ASSET Intertech, Inc. (2012), 2 pgs.

(Continued)

*Primary Examiner* — Sujoy Kundu
*Assistant Examiner* — Paul D Lee
(74) *Attorney, Agent, or Firm* — Fish & Richardson P.C.

(57) ABSTRACT

A tester on a device under test to test component circuitry of the device under test, the tester comprising: logic configured with firmware to implement test circuitry comprising: protocol generators that are configurable to generate protocols; pattern generators that are configurable to provide test patterns that are drivable according to one or more of the protocols; and a system controller to select, in response to a program input, a test pattern and a protocol with which to test the component circuitry.

20 Claims, 3 Drawing Sheets

(56) References Cited

U.S. PATENT DOCUMENTS

| | | | |
|---|---|---|---|
| 2012/0191402 A1* | 7/2012 | Filler et al. | 702/119 |
| 2012/0221285 A1 | 8/2012 | Conner | |
| 2013/0110445 A1 | 5/2013 | Kaushansky et al. | |
| 2013/0110446 A1 | 5/2013 | Bourassa et al. | |
| 2013/0111505 A1 | 5/2013 | Frick et al. | |
| 2013/0138383 A1* | 5/2013 | Filler et al. | 702/123 |
| 2013/0145212 A1* | 6/2013 | Hsu et al. | 714/27 |
| 2014/0156253 A1* | 6/2014 | McIlvain et al. | 703/28 |

OTHER PUBLICATIONS

"Altera, Design Debugging Using the SignalTap II Logic Analyzer," Quartus II Handbook Version 13.1(3): Verification (Nov. 2013), 70 pgs.

"ChipScope Pro Software and Cores, User Guide," UG029 (v13.3) (Oct. 19, 2011), 210 pgs.

J. Ferry, J. Scesnak, and S. Shaikh "A Strategy for Board Level In-System Programmable Built-In Assisted Test and Built-In Self Test", Proceedings IEEE International Test Conference, 2005, Paper 32.3.

S. Devadze, A. Jutman, I. Aleksejev, and R. Ubar, "Fast Extended Test Access via JTAG and FPGAs", Proceedings IEEE International Test Conference, 2009, Paper 2.3.

NI Labview FPGA, downloaded from the internet on Jan. 23, 2014 at http://www.ni.com/labview/fpga/.

NI CompactRIO, downloaded from the internet on Jan. 23, 2014 at http://www.ni.com/compactrio/.

Tektronics, downloaded from the internet on Jan. 23, 2014 at http://www.tek.com/embedded-instrumentation.

Intellitech downloaded from the Internet on Jan. 23, 2014 at http://www.embedded.com/electronics-products/electronic-product-reviews/prototyping-and-development/4416634/Intellitech-supports-Silicon-Instrurments-thru-new-JTAG-Standard.

International Search Report and the Written Opinion of the International Searching Authority, or the Declaration for PCT/US2014/010418 mailed Apr. 25, 2014, 12 pages.

IEEE Standard for Test Access Port and Boundary-Scan Architecture, IEEE Standards Association, IEEE Std 1149.1, 2013, 422 pages.

IEEE Standard for Test Access and Control of Instrumentation Embedded within a Semiconductor Device, IEEE Standards Association, IEEE Std 1687, 2014, 283 pages.

* cited by examiner

EMBEDDED TESTER

TECHNICAL FIELD

This patent application relates generally to a configurable embedded tester.

BACKGROUND

Self-test may include incorporating a test system, referred to herein as an "embedded tester", onto a device. The embedded tester may be used to test any appropriate structure and/or function of the device.

Embedded testers may be incorporated into devices, such as printed circuit board assemblies (PCBAs), by configuring/re-configuring on-board logic. Through such a process, the logic essentially becomes a miniature tester capable of testing the device. In cases involving programmable logic, the process starts as dedicated test firmware overwrites mission mode firmware for the device. Then, testing is conducted, and the logic is reverted back to its original mission-mode configuration.

SUMMARY

In general, in one aspect, a tester on a device under test to test component circuitry of the device under test includes logic configured with firmware to implement test circuitry comprising: protocol generators that are configurable to generate protocols; pattern generators that are configurable to provide test patterns that are drivable according to one or more of the protocols; and a system controller to select, in response to a program input, a test pattern and a protocol with which to test the component circuitry.

Implementations of the disclosure can include one or more of the following features. In some implementations, the tester further includes a pattern controller to (i) control driving of output to the component circuitry, the output being based on the selected pattern and the selected protocol, and (ii) to receive a test result from the component circuitry in response to the output. In other implementations, the system controller is configured to receive the program input, to generate one or more commands according to the program input, and to send the one or more commands to the pattern controller; wherein the pattern controller is responsive to the one or more commands to generate the output from the selected pattern and the selected protocol. In yet other implementations, the pattern controller comprises a vector controller that is configured to alter the selected pattern and the selected protocol.

In still other implementations, the tester includes a clock generator to provide clocking information; wherein the system controller is configured to request and to receive the clocking information from the clock generator, and to affect edge placement of test signals. In some implementations, the system controller is configurable to change the clocking information and to output the changed clocking information to one or more components of the tester. In other implementations, the system controller is configurable to generate a number of test ports for the tester.

In other implementations, the system controller is configurable to generate the number of test ports by replicating test ports, including components thereof, the number of times. In still other implementations, each test port comprises: a driver to drive the output to the component circuitry; a receiver to receive the response; and a trigger detector to identify features of the response and to output a signal following detecting of a feature. In still other implementations, each test port further comprises: a port controller responsive to the system controller to affect driving the output from the driver. In some implementations, the tester includes a pattern memory, the pattern memory being configurable with information to control repetitions of patter vectors in the output.

In still other implementations, the logic comprises one of a field programmable gate array (FPGA) or an application-specific integrated circuit (ASIC). In some implementations, the system controller is configurable to detect a protocol of the DUT and to select the protocol corresponding to the protocol of the DUT. In yet other implementations, the device under test comprises component circuitries that operate using different communication protocols; and wherein the test circuitry is configurable to test at least one of the component circuitries. In still other implementations, the pattern generator is configured to provide previously generated test vectors that can be applied as tester stimuli; or wherein the pattern generator is configured to provide test vectors that are generated dynamically. In some implementations, the tester is embedded in the device under test and is configurable to test multiple circuit components of the device under test using different protocols.

In still another aspect of the disclosure, a method of configuring a tester on a device under test to test component circuitry of the device under test includes configuring logic with firmware to implement test circuitry comprising: protocol generators that are configurable to generate protocols; pattern generators that are configurable to provide test patterns that are drivable according to one or more of the protocols; and a system controller to select, in response to a program input, a test pattern and a protocol with which to test the component circuitry.

Implementations of the disclosure can include one or more of the following features. In some implementations, the test circuitry comprises an output controller to (i) control driving of output to the component circuitry, the output being based on the selected pattern and the selected protocol, and (ii) to receive a test result from the component circuitry in response to the output. In other implementations, the method further includes preventing mission code from being loaded into logic on the apparatus, the mission code for causing the apparatus to perform functions other than test; wherein configuring the logic comprises configuring the logic with the firmware.

In yet another aspect of the disclosure, one or more machine-readable media store instructions that are executable to perform operations comprising: configuring logic with firmware to implement test circuitry comprising: protocol generators that are configurable to generate protocols; pattern generators that are configurable to provide test patterns that are drivable according to one or more of the protocols; and a system controller to select, in response to a program input, a test pattern and a protocol with which to test the component circuitry; wherein the test circuitry is part of a tester that is on a device under test, the tester for testing component circuitry of the device under test. Implementations of this aspect of the present disclosure can include one or more of the foregoing features.

Any two or more of the features described herein, including in this summary section, may be combined to form embodiments not specifically described herein.

All or part of the foregoing may be implemented as a computer program product comprised of instructions that are stored on one or more non-transitory machine-readable storage media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DETAILED DESCRIPTION

Described herein are example implementations of an embedded tester that may be used to test various types of devices or systems. The example implementations are described in the context of automated test equipment (ATE). In this example, the ATE, or component circuitry thereof, is the device under test (DUT). However, the example embedded testers described herein are not limited to use in an ATE context. Rather, such systems may be incorporated into any appropriate device. For example, an embedded tester may be incorporated into a chip set, a printed circuit board assembly (PCBA), a device or system such as a cellular telephone, tablet, or the like, or any other appropriate device containing components to be tested.

Figure 1:
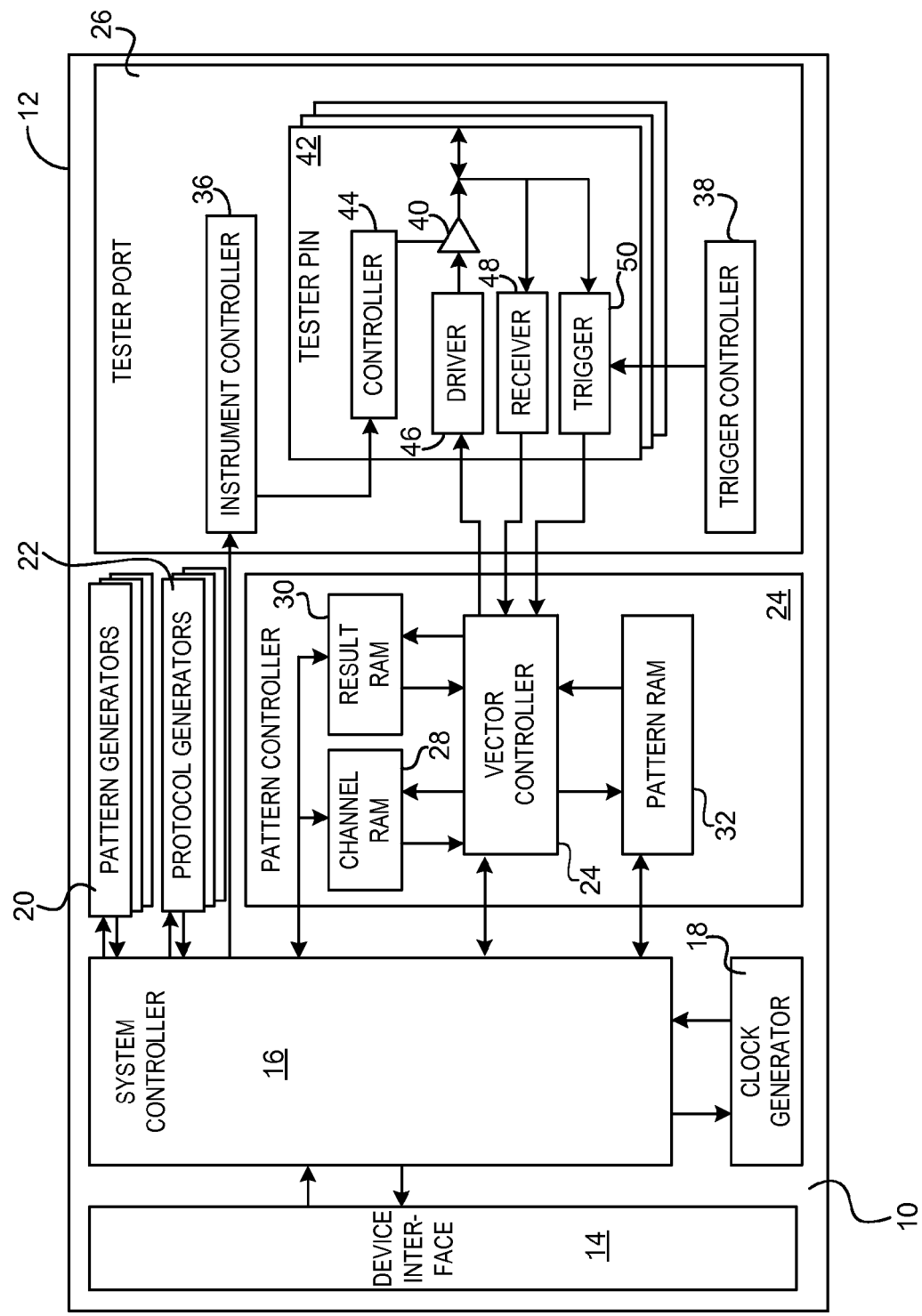
FIG. 1 is block diagram of an example embedded tester.

An example implementation of an embedded tester 10 programmed into an FPGA 12 of a system to be tested is shown in FIG. 1. Example embedded tester 10 includes, but is not limited to, a device interface 14, a system controller 16, a clock generator 18, pattern generators 20, protocol generators 22, a pattern controller 24, and test port control circuitry 26. Examples of these features are described below.

System controller 16 contains a command router (not shown) for receiving and routing instructions issued by a user (e.g., a test engineer). These instructions may be received via device interface 14, and may provide information about the type of testing to be performed. The instructions may be device-specific. An example instruction set may specify, for a test protocol: pin function setup, including a number of test pins for the embedded tester; trigger definitions including information for triggering identification of data received from a device under test (DUT) (in this example, the DUT for the embedded tester is the system in which the tester is embedded, or component circuitry of that system); pattern data and control information, including information for selecting a test pattern/pattern generator and for modifying a test pattern; capture results and pass/fail data, including information specifying what constitutes passing or failing a test; instrument status, including watchdog and execution states; and clock configuration, including configurable (e.g., programmable) attributes of a clock, such as frequency. This information, along with other information not described herein, may be programmed into various elements of the embedded tester in order to implement a test protocol.

Pattern controller 24 includes both memory and execution engines for deployment of patterns during testing. In an example implementation, pattern controller 24 receives patterns and pattern conditioning data from, or via, system controller 16, and outputs those patterns to a DUT. Pattern controller 24 also receives test results from the DUT, via test port control circuitry 26, and outputs those test results to system controller 16.

Pattern controller 24 includes memory elements, including channel RAM 28, result RAM 30, and pattern RAM 32. The memory elements may be based on the internal RAM blocks of the FPGA and store drive and control data for input test patterns (also referred to as test vectors). Result RAM 30 stores captured responses from the DUT as well as pass/fail information. Channel RAM 28 stores patterns (e.g., data) to be driven to a DUT, with which to test the DUT. Pattern RAM 32 stores data for sequencing during testing. For example, pattern RAM 32 holds instructions for looping test patterns. These instructions may be executed to repeat certain patterns following output of a stimulus and receipt of a response thereto. Information in the pattern RAM and the channel RAM is programmable.

Vector controller 34 is configurable to control overall execution of pattern bursts during test. In operation, vector controller 34 reads commands and pattern instructions from channel RAM 28 and pattern RAM 32 at a speed defined by the user. Pin states are sent to internal test pins in test port control circuitry 26, which drives and monitors resulting responses of the DUT. Based on the user's pattern control requirements, vector controller 34 may be configured to loop through appropriate channel states for testing while capturing and storing test results. Instructions in pattern RAM 32 may be used to implement such looping. Vector controller 34 also receives test results from test port control circuitry 26, stores the test results in result RAM 30, and makes the test results available to (e.g., provides them to) system controller 16.

Test port control circuitry 26 includes individual pin logic and instrument and trigger controls. In an example implementation, test port control circuitry 26 includes instrument controller 36 and trigger controller 38. Instrument controller 36 controls timing for turning an output driver on/off through circuit element 40, and is responsive to instructions from system controller 16. Trigger controller 38 indicates which data from a test pin constitutes valid test result data (as opposed to noise or the like). For example, trigger controller 38 monitors test result data received from the UUT for certain events, such as a high, a low, a pattern of highs and lows, rising edge, falling edge, etc. Test result data having one or more of those events is deemed, by the pattern controller, to be valid test result data. In some implementations, trigger controller 38 is configured to detect signal level-high, level-low, rising-edge, and falling edge events. Each trigger event may be user-programmable into the trigger controller, allowing the user flexibility in monitoring and driving test data. Additionally, there may be two trigger busses that can be connected to vector controller 34, enabling conditional operation depending on events detected by the test pins and the assigned trigger control.

Test pins 42 control what is driven/tri-stated and assert trigger lines when events are observed. The number of test pins is configurable. For example a number of test pins can be instantiated in an embedded tester in response to an input from the user. In some implementations, multiple numbers of test ports (including test pins) may be instantiated for each embedded tester, e.g., the number may be scalable by a variable during building of the embedded system. However, in other implementations any appropriate number of test pins may be instantiated.

In some implementations, a test pin 42 may include a controller 44, which is responsive to instrument controller 36 to control driving of output from the test pin. A driver 46 drives test patterns to the UUT; a receiver 48 receives test result data from the UUT; a trigger detector 50 is responsive to the trigger control to generate a signal each time test result data has a specific characteristic, and a circuit element 40, such as amplifier, buffer, or the like, is included through which the test data is output to the UUT. For receipt of test result data, the example embedded tester may be configured to implement direct capture or window capture. For direct capture, inputs are sampled on a single clock edge. For window capture, an input is sampled at one clock edge (the "open window") and again on another clock edge (the "close window"). Sampling may be performed using the trigger controller. If the values are different at the two sampling times, the pattern controller will log the capture as a failure. This gives additional assurance that the captured test result data is stable and reliable. If the values are the same (or within a tolerance) at the two sampling times, the pattern controller identify the sample as valid test data.

In some implementations, there may be flexibility regarding signal edge placement. For example, system controller 16 may be configured to adjust the phase of any of the tester clocks. If there is skew or delays are required from one circuit to the next, an instruction can be called to implement the skews or delays. The phase may be adjusted to affect edge placement of test signals.

While there is no theoretical limit to the speed or to the number of test pins/channels that may be programmed in an FPGA, there may be restrictions that are based on the size and complexity of the FPGA. For signaling, embedded test pins can be multiplexed internal to the FPGA. As a result, a relatively small embedded tester can be synthesized in an FPGA, but a relatively wide matrix could route the test patterns to nearly any appropriate external pin. Since clocks in FPGAs can be phase-adjusted, resulting routing delays can be compensated. If high-speed applications are desired, on-chip DDR (Double Data Rate) and SerDes elements can be employed to increase the pattern rate experienced by the UUT.

System controller 16 may receive a clock signal from clock generator 18. Clock generator 18 may be programmed to adjust clock edges and move them in time. System controller 16 may adjust clocking for both driving and receiving test patterns based on a clock signal received from the clock generator. As noted, system controller 16 may adjust this clock signal in accordance with program input from a user or automatically based on instructions run by the system controller. The clock signal is adjustable for both driving and receiving test patterns. In some implementations, on the stimulus (driving) side, drivers can output certain states (logical 0, 1, and hi-impedance (z)) on an assertion clock, and then return to a predefined state on a return clock. In some implementations, the return state options are return-to-1, return-to-0, return-to-complement, return-to-off, and none.

The example embedded tester may be dynamic for at-speed testing. Accordingly, a user (e.g., a test engineer) performing the testing can set-up the embedded tester, without requirements regarding instruction upload times, and then simply execute a pattern set. Pattern controller 24 controls the remaining functions. Additionally, a watchdog system may be incorporated in the embedded tester to enable users to address issues that may result from manufacturing or operational defects. This watchdog may be programmable and can be included as an element to test.

Since the example embedded system is inside the device to be tested (e.g., ATE), its logical interface can be altered to match a test set-up. An IEEE 1149.1 test access port included in an FPGA may be used by test programs to command and control the embedded tester. However, in example implementations, any protocol such as I2C, SPI, UART, and so forth may be used to control the embedded tester Control may be performed through device interface 14.

Example embedded tester 10 may include one or more pattern generators 20. Pattern generators 20 are configured to generate test patterns for use in testing a DUT. For example, the pattern generators may be programmable to generate custom test patterns, or they may be hard-coded to generate predefined test patterns In some implementations, pattern generators 20 are engines that reside within the embedded tester to facilitate automated test development. The pattern generators can populate the embedded tester with test patterns that can then be executed as part of a test protocol. The pattern generators may include, but are not limited to, the following: pseudo-random pattern generators, multiple and single input signature generators, gray code and sine table pattern generators, memory march process pattern generators, checkerboard/walking-1/walking-0 generators, and a CRC (cyclic redundancy check) engine. With inputs to set-up the pattern generator parameters, large amounts of test patterns can be generated for a DUT test application.

In some implementations, pattern generators 20 are predefined, and implement one or more of the patterns described above. In operation, system controller 16 may receive program input from device interface 14, select a pattern generator(s) based on that input, and receive one or more patterns from the selected pattern generator. System controller 16 may receive those patterns, pass them as-is to pattern controller 24, or modify the patterns prior to output to the pattern controller. The patterns may be modified in accordance with the program input.

In some implementations, a user may program test patterns for use in testing the DUT in the system controller (e.g., and not use a test pattern from a pattern generator). As noted, a user may also adjust a test pattern provided by a pattern generator by appropriately programming the system controller. In some implementations, the user may combine test patterns from different pattern generators in the system controller to produce a new test pattern.

Embedded tester 10 may include one or more protocol generators 22. Protocol generators 22 are configurable to specify protocols according to which test patterns are driven from the test circuitry to the component circuitry. In more detail, these protocol generators may target specific communications protocols. Protocol generators 22 may be used to generate data to implement testing using one or more of the following protocols: serial bus protocols, such as I2C, SPI, Microwire™, JTAG, and UART; parallel bus protocols for, e.g., commodity memory components and non-memory DDR devices; digital signal processing protocols involving FFTs and FIRs; encryption/decryption engines and other codecs; and custom components, which may be developed on a needed basis.

In some implementations, the protocol generators are programmable to generate custom (user-defined) protocols. In some implementations, the protocol generators are predefined, and implement one or more of the protocols described above. In operation, system controller 16 may receive program input from device interface 14, select a protocol generator(s) based on that input, and receive data identifying one or more protocols from the selected pattern generator. System controller 16 may receive data identifying the protocol, pass data identifying the protocol as-is to pattern controller 24 (which modifies the pattern to comport with the received protocol), or modify the protocol(s) prior to output to the pattern controller and output data for the modified protocol to the pattern controller (which modifies the pattern to comport with the modified protocol). The protocol may be modified in accordance with the program input.

In some implementations, the embedded tester is protocol aware. For example, the system controller may output data to a DUT being tested by the embedded tester to identify the communication protocol used by that device. The appropriate protocol generator may be selected based on the device's response. If a protocol generator is not available for the protocol identified by the device, the system controller may be programmed to operate as a protocol generation circuit to generate the appropriate protocol. In some implementations, the FPGA (or other logic) in which the embedded system is configured may also be programmed with a protocol generation circuit. An example protocol generation circuit that may be used in the example embedded system is described in U.S. Pat. No. 8,195,419, the contents of which are hereby incorporated by reference into this application as if set forth herein in full.

During operation of the embedded system, there are numerous pin codes available for use by the system controller and/or pattern generators to develop test patterns. Examples of such pin codes are displayed in Table 1 below:

TABLE 1

| Drive high | Drive low | Expect high | Expect low |
|---|---|---|---|
| Drive high, expect low | Drive low, expect high | Drive and expect high | Drive and expect low |
| No change | Toggle previous code | Do not drive or expect | |

Along with pattern data, it is possible to dynamically change the execution steps by including conditional elements. Possible operations for changing execution steps are listed in the Table 2 below:

TABLE 2

| Begin loop | Begin counted loop | End loop | Jump to vector |
|---|---|---|---|
| Begin repeat | Begin repeat count | Halt | None |

Regarding test execution, one way to speed pattern load-up is by "firm-coding" user pattern data. In many FPGA families that implement internal block memory, an FPGA designer may include a table that will pre-program the user RAM. An FPGA-embedded embedded tester can take advantage of this by preloading final test patterns when the FPGA configuration file is developed. So, not only is the embedded tester ready to run, but also the full test suite is available to execute when the test firmware is loaded. However, since the implementation is still in RAM, test engineers can load new pattern sets to meet the needs of changing production strategies.

In some implementations, the amount of internal memory available to firmware applications can be limited. This, in turn, can restrict the amount of test patterns that can be stored at one time within an embedded tester. However, if there is external memory connected to the FPGA, the embedded tester can make use of that memory to store one or more blocks of test patterns for later use.

In some implementations, the example embedded tester may include a generic logic analyzer, which includes a graphical user interface and corresponding underlying code. The generic logic analyzer enables any FPGA on the board to become a fast debug instrument for testing. Another utility may be implemented turn a simple spreadsheet of patterns into a deployable test set.

Figure 2:
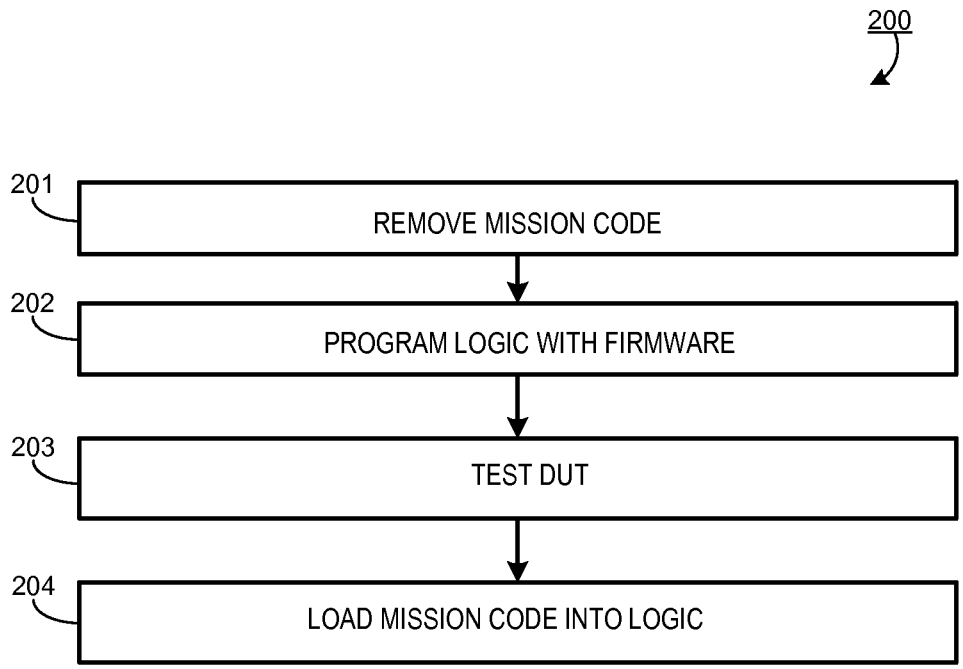
FIG. 2 is a flowchart of an example process for using an embedded tester.

Referring to FIG. 2, a process 200 is shown for testing a system (or any appropriate device) using the example embedded tester described herein. According to process 200, if there is mission code for the system in an FPGA that is targeted for use by an embedded tester, the mission code for the system is removed (201) from the FPGA (or any other programmable logic) on the system. As indicated above, the mission code is for causing the system to perform functions other than testing component circuitry of the system. Code stored in the FPGA may enable the mission code to be over-written.

The FPGA is programmed (202) with firmware to implement the example embedded tester described herein. As indicated above, the example embedded tester implemented in the FPGA may include, but is not limited to, the following features: pattern generators to provide test patterns; protocol generators to provide protocols according to which test patterns are driven from the test circuitry to the component circuitry; a system controller to select, in response to a program input, a test pattern and a protocol with which to test the component circuitry; and an output controller to (i) control driving of output to the component circuitry, where the output is based on the selected pattern and the selected protocol, and (ii) to receive a test result from the component circuitry in response to the output.

According to process 200, the device, in this case the system, is tested (203) using the embedded tester. Thereafter, the original mission code is loaded (204) into the FPGA in place of the embedded tester. Code stored in the FPGA may load the mission code into the FPGA following testing or a processing device outside of the FPGA may load the mission code into the FPGA following testing.

Figure 3:
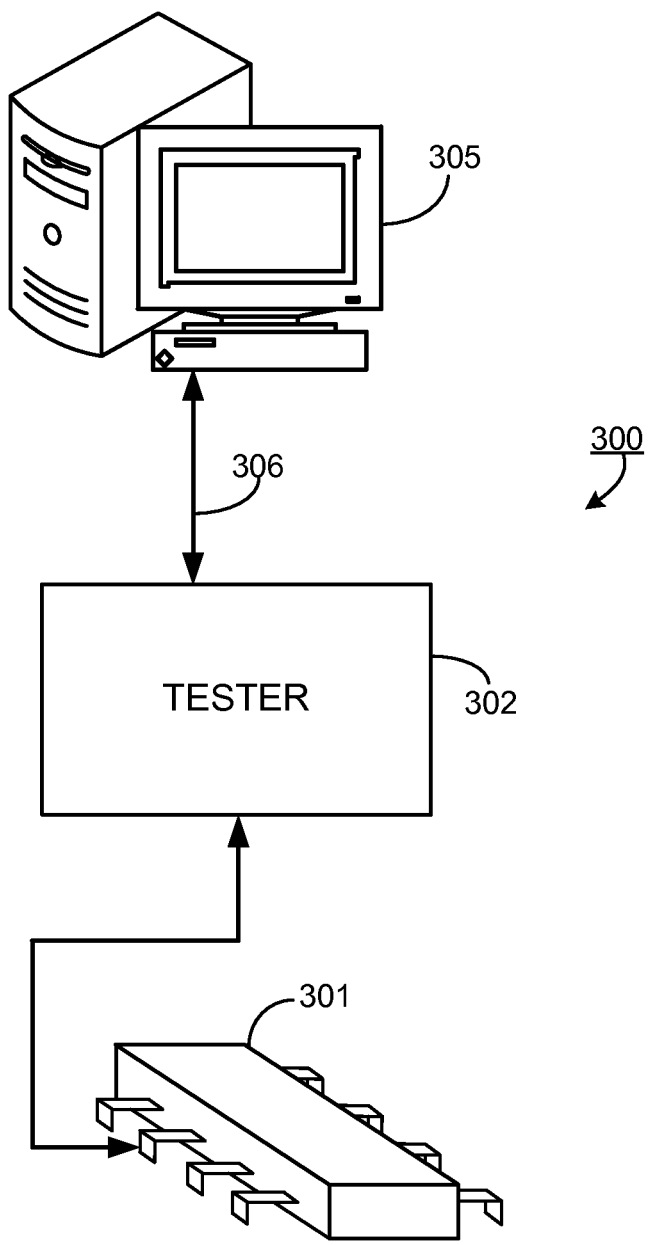
FIG. 3 is a block diagram showing an example test system that may be tested using an embedded tester.

Referring now to FIG. 3, that figure shows an example of a system (test system 300) containing logic on which the embedded tester described herein may be programmed. FIG. 3 shows an example system 300 for testing a unit under test (UUT) UUT 301. Test system 300 includes a tester 302. To interact with tester 302, system 300 includes a computer system 305 that interfaces with tester 302 over a network connection 306. Computer system 305 may be an external computer that interacts with computational circuitry on the test instrument. Typically, computer system 305 sends commands to tester 302 to initiate execution of routines and programs for testing UUT 301. Such executing test programs may initiate the generation and transmission of test signals to the UUT 301 and collect responses from the UUT. Various types of UUTs may be tested by system 300. For example, UUTs may be avionics, radar, weaponry, semiconductor devices, and so forth.

To provide test signals and collect responses from the UUT, tester 302 is connected, via an appropriate FPGA interface, to one or more connector pins or test probes that provide an interface for the internal circuitry of UUT 301. For illustrative purposes, in this example, device tester 302 is connected to a connector pin of UUT 301 via a hardwire connection to deliver test signals (to the internal circuitry of UUT 301). Device tester 302 also senses signals at UUT 301 in response to the test signals provided by device tester 302. For example, a voltage signal or a current signal may be sensed at a UUT pin in response to a test signal. Such single port tests may also be performed on other pins included in UUT 301. For example, tester 302 may provide test signals to other pins and collect associated signals reflected back over conductors (that deliver the provided signals). In some examples, by collecting the reflected signals, the input impedance of the pins may be characterized along with other single port testing quantities. In other test scenarios, a digital signal may be sent to UUT 301 for storage on UUT 301. Once stored, UUT 301 may be accessed to retrieve and send the stored digital value to tester 302. The retrieved digital value may then be identified to determine if the proper value was stored on UUT 301.

Along with performing one-port measurements, a two-port test may also be performed by device tester 302. For example, a test signal may be injected to a pin on UUT 301 and a response signal may be collected from one or more other pins of UUT 301. This response signal is provided to device tester 302 to determine quantities, such as gain response, phase response, and other throughput measurement quantities.

The embedded tester described herein, or individual features thereof, herein can be implemented, at least in part, via a computer program product, e.g., a computer program tangibly embodied in one or more information carriers, e.g., in one or more tangible, non-transitory machine-readable storage media, for execution by, or to control the operation of, data processing apparatus, e.g., one or more programmable processor, a computer, or multiple computers to program a logic device.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the embedded tester can be performed by one or more programmable processors executing one or more computer programs to perform the functions of the calibration process. All or part of the embedded tester can be implemented on special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Elements of different implementations described herein may be combined to form other implementations not specifically set forth above. Other implementations not specifically described herein are also within the scope of the following claims.

What is claimed is:

1. A device under test (DUT) comprising:
   programmable logic; and
   one or more processing devices programmed to replace mission code in the programmable logic on the DUT with firmware to perform testing of the DUT, and to replace the firmware with the mission code following testing of the DUT;
   wherein the programmable logic, when configured with the firmware, comprises test circuitry to perform the testing, the test circuitry comprising:
      protocol generators that are configurable to generate protocols;
      pattern generators that are configurable to provide test patterns that are drivable according to one or more of the protocols; and
      a system controller to select a test pattern and a protocol with which to test the DUT, and to control testing of the DUT based on the test pattern and the protocol.

2. The DUT of claim 1, wherein the test circuitry comprises a pattern controller to (i) control driving of an output to component circuitry of the DUT, the output being based on the selected pattern and the selected protocol, and (ii) to receive a test result from the component circuitry in response to the output.

3. The DUT of claim 1, wherein the system controller is configured to receive a program input, to generate one or more commands according to the program input, and to send the one or more commands to a pattern controller;
   wherein the pattern controller is responsive to the one or more commands to generate an output from the selected pattern and the selected protocol.

4. The DUT of claim 3, wherein the pattern controller comprises a vector controller that is configured to alter the selected pattern and the selected protocol.

5. The DUT of claim 3, wherein the test circuitry comprises:
   a clock generator to provide clocking information;
   wherein the system controller is configured to request and to receive the clocking information from the clock generator, and to affect edge placement of test signals.

6. The DUT of claim 5, wherein the system controller is configurable to change the clocking information and to output the changed clocking information to one or more components of the test circuitry.

7. The DUT of claim 1, wherein the system controller is configurable to generate a number of test ports for the test circuitry.

8. The DUT of claim 7, wherein the system controller is configurable to generate the number of test ports by replicating test ports, including components thereof, the number of times.

9. The DUT of claim 7, wherein each test port comprises:
   a driver to drive the output to component circuitry;
   a receiver to receive the response; and
   a trigger detector to identify features of the response and to output a signal following detecting of a feature.

10. The DUT of claim 9, wherein each test port further comprises:
    a port controller responsive to the system controller to affect driving the output from the driver.

11. The DUT of claim 1, wherein the test circuitry comprises a pattern memory, the pattern memory being configurable with information to control repetitions of pattern vectors in an output.

12. The DUT of claim 1, wherein the programmable logic comprises one of a field programmable gate array (FPGA) or an application-specific integrated circuit (ASIC).

13. The DUT of claim 1, wherein the system controller is configurable to detect a protocol of the DUT and to select the protocol corresponding to the protocol of the DUT:
wherein detecting the protocol of the DUT comprises:
outputting a signal to the DUT;
receiving a response to the signal from the DUT; and
detecting the protocol by analyzing the response.

14. The DUT of claim 1, wherein the DUT comprises component circuitries that operate using different communication protocols; and
wherein the test circuitry is configurable to test at least one of the component circuitries.

15. The DUT of claim 1, wherein a pattern generator of the pattern generators is configured to provide previously generated test vectors that can be applied as tester stimuli; or
wherein the pattern generator is configured to provide test vectors that are generated dynamically.

16. The DUT of claim 1, wherein the test circuitry is configurable to test multiple circuit components of the device under test using different protocols.

17. A method of configuring a tester on a device under test (DUT), the method comprising:
configuring programmable logic on the DUT with firmware to implement test circuitry, the configuring comprising one or more processing devices operating to replace mission code in the programmable logic on the DUT with firmware to perform testing of the DUT, and to replace the firmware with the mission code following testing of the DUT;
wherein the programmable logic, when configured with the firmware, comprises test circuitry to perform the testing, the test circuitry comprising:
protocol generators that are configurable to generate protocols;
pattern generators that are configurable to provide test patterns that are drivable according to one or more of the protocols; and
a system controller to select a test pattern and a protocol with which to test the DUT, and to control testing of the DUT based on the test pattern and the protocol.

18. The method of claim 17, wherein the test circuitry comprises an output controller to (i) control driving of an output to component circuitry of the DUT, the output being based on the selected pattern and the selected protocol, and (ii) to receive a test result from the component circuitry in response to the output.

19. The method of claim 17, wherein the mission code is for causing the DUT to perform functions other than test.

20. One or more non-transitory machine-readable media storing instructions that are executable to configure a device under test (DUT) by performing operations comprising:
configuring programmable logic on the DUT with firmware to implement test circuitry, the configuring comprising one or more processing devices operating to replace mission code in the programmable logic on the DUT with firmware to perform testing of the DUT, and to replace the firmware with the mission code following testing of the DUT;
wherein the programmable logic, when configured with the firmware, comprises test circuitry to perform the testing, the test circuitry comprising:
protocol generators that are configurable to generate protocols;
pattern generators that are configurable to provide test patterns that are drivable according to one or more of the protocols; and
a system controller to select a test pattern and a protocol with which to test the DUT, and to control testing of the DUT based on the test pattern and the protocol.

* * * * *